United States Patent
Lee

(10) Patent No.: US 7,068,567 B2
(45) Date of Patent: Jun. 27, 2006

(54) DATA OUTPUT CONTROLLER IN SEMICONDUCTOR MEMORY DEVICE AND CONTROL METHOD THEREOF

(75) Inventor: Hyun Woo Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/964,341

(22) Filed: Oct. 13, 2004

(65) Prior Publication Data

US 2005/0243607 A1 Nov. 3, 2005

(30) Foreign Application Priority Data

Apr. 30, 2004 (KR) ................. 10-2004-0030571

(51) Int. Cl.
*G11C 8/00* (2006.01)
(52) U.S. Cl. ............ 365/233; 365/189.02; 365/189.05; 365/189.12; 365/194
(58) Field of Classification Search ................ 365/233, 365/189.02, 189.05, 189.12, 194
See application file for complete search history.

(56) References Cited

U.S. PATENT DOCUMENTS 6,985,401 B1 * 1/2006 Jang et al. .................. 365/233

\* cited by examiner

*Primary Examiner*—Richard Elms
*Assistant Examiner*—Pho M. Luu
(74) *Attorney, Agent, or Firm*—Ladas & Parry LLP

(57) ABSTRACT

A data output controller of a high-speed memory device and a method therefor. The data output controller includes a first section for detecting a unit delay multiple of an external clock signal based on the external clock signal and a delay circuit of the external clock signal, a second section for analyzing data in an information storage unit, in which an internal timing is defined, by using values detected by the first section, and a third section for adjusting a data output timing in accordance with predetermined CAS latency based on analyzed values obtained through the second section. The data output controller to indicate an optimal point of a data output indicated by CAS latency information.

8 Claims, 7 Drawing Sheets

DATA OUTPUT CONTROLLER IN SEMICONDUCTOR MEMORY DEVICE AND CONTROL METHOD THEREOF

BACKGROUND OF THE INVENTION

1. Field of the Invention

The present invention relates to a data output controller of a high frequency memory device, and more particularly to a controller and a method for controlling a data output of a high-speed memory device by using CAS latency.

2. Description of the Prior Art

Generally, a period of time required for outputting data out of a chip after applying a read command to a memory device is defined in a specification. Typically, such a period of time required for outputting data is represented as CAS latency (CL), which is a number of external clock signals. For instance, if CL is 4, data are outputted after four clocks. The CAS latency is initially determined according to an MRS (mode register set) signal.

That is, since data are outputted from a memory device in accordance with a time defined in the specification, the CAS latency may increase as frequency of the memory device becomes increased. For instance, if the frequency of the memory device increases by two times during a predetermined period of data output time, the CAS latency may increase from 4 to 8. However, currently used high-speed memory devices cannot continuously increase the CAS latency according to an increase of the frequency thereof.

This is because the high-speed memory devices equipped with a conventional CAS latency technique may restrict an operation of an internal counter, which controls the data output time according to the CAS latency. For example, if the CAS latency is 12 and a period of time for an external clock signal tCK is 1 ns, DLL CLK is generally advanced by 3.5 ns and a time required for analyzing a read command is 2.5 ns. In addition, if a period of time from the read command to the data output is 12 ns, a time assigned to an internal counter is 6 ns (12 ns−3.5 ns−2.5 ns=6 ns). Herein, the internal counter generates 11 counter signals in order to synchronize the data output time with the CAS latency of 12. Accordingly, if at least 600 ps of time is required for one counter action of the internal counter, a time for the internal counter is represented as 11×6.6=6.6 ns, which exceeds the time (6 ns) assigned to the internal counter. Therefore, it is difficult to precisely control the data output time.

SUMMARY OF THE INVENTION

Accordingly, the present invention has been made to solve the above-mentioned problems occurring in the prior art, and an object of the present invention is to provide a controller and a method capable of preventing a high-speed memory device from malfunctioning by precisely controlling a data output time of the high-speed memory device.

Another object of the present invention is to provide a technique for outputting data by externally synchronizing the data with CAS latency while selectively using an output enable control signal if the CAS latency of a high-speed memory device has been determined.

In order to accomplish the above objects, according to a first aspect of the present invention, there is provided a data output controller of a semiconductor device, the data output controller comprising:

a delay unit for delaying an external clock signal;
a delay line for delaying an output signal of the delay unit;
a phase detector for detecting a differential phase between the external clock signal and an output signal of the delay line;
a clock counter/delay line control unit for outputting a counter signal capable of controlling a time delay of the delay line in response to an output signal of the phase detector;
a timing decoder/register for checking frequency of the external clock signal in response to an output signal of the clock counter/delay line control unit and storing information related to the frequency; and
a multiplexer for receiving a plurality of output enable control signals, wherein the multiplexer selects one of output enable control signals according to the frequency information of the external clock signal which is checked by the timing decoder/register, and the output enable control signals include CAS latency of the semiconductor memory device and control an operation of an output driver of the semiconductor memory device.

According to the preferred embodiment of the present invention, if the CAS latency of the memory device is n, the output enable control signal outputted from the multiplexer includes one of a first output enable control signal representing the CAS latency of n, a second output enable control signal representing the CAS latency of n−1, and a third output enable control signal representing the CAS latency of n−2.

According to the preferred embodiment of the present invention, if the CAS latency of the memory device is n, the output enable control signal outputted from the multiplexer includes one of a first output enable control signal representing the CAS latency of n and a plurality of output enable control signals representing the CAS latency less than n.

In order to accomplish the above objects, according to a second aspect of the present invention, there is provided a data output controller of a semiconductor device, the data output controller comprising: a first means for detecting a unit delay multiple of an external clock signal based on the external clock signal and a delay circuit of the external clock signal; a second means for analyzing data in an information storage unit, in which an internal timing is defined, by using values detected by the first means; and a third means for adjusting a data output timing in accordance with predetermined CAS latency based on analyzed values obtained through the second means.

According to the preferred embodiment of the present invention, the first means includes a delay unit for delaying the external clock signal, a delay line for delaying an output signal of the delay unit, and a phase detector for detecting a differential phase between the external clock signal and an output signal of the delay line.

The second means includes a clock counter/delay line control unit for outputting a counter signal capable of controlling a time delay of the delay line in response to an output signal of the phase detector and a timing decoder/register for checking frequency of the external clock signal in response to an output signal of the clock counter/delay line control unit and storing information related to the frequency.

The third means includes a multiplexer for receiving a plurality of output enable control signals in order to control a data output enable time n response to an output signal of the timing decoder/register In order to accomplish the above objects, according to a third aspect of the present invention, there is provided a method for controlling an output of data in a semiconductor memory device, the method comprising the steps of: i)

detecting a unit delay multiple of an external clock signal based on the external clock signal and a delay of the external clock signal; ii) analyzing data in an information storage unit, in which an internal timing is defined, based on values detected in step i); and iii) adjusting a data output timing in accordance with predetermined CAS latency based on values analyzed in step ii).

According to the preferred embodiment of the present invention, step ii) includes the substeps of: storing a timing of an internal signal by using a ROM, in which a period of time required for generating a signal created by analyzing a read command from an input of an external clock is stored as a multiple of a unit delay timing; storing a read replica as a multiple of CUD by using the ROM; and calculating cycles of lost DDL-clocks by using data stored in the ROM.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

Figure 1:
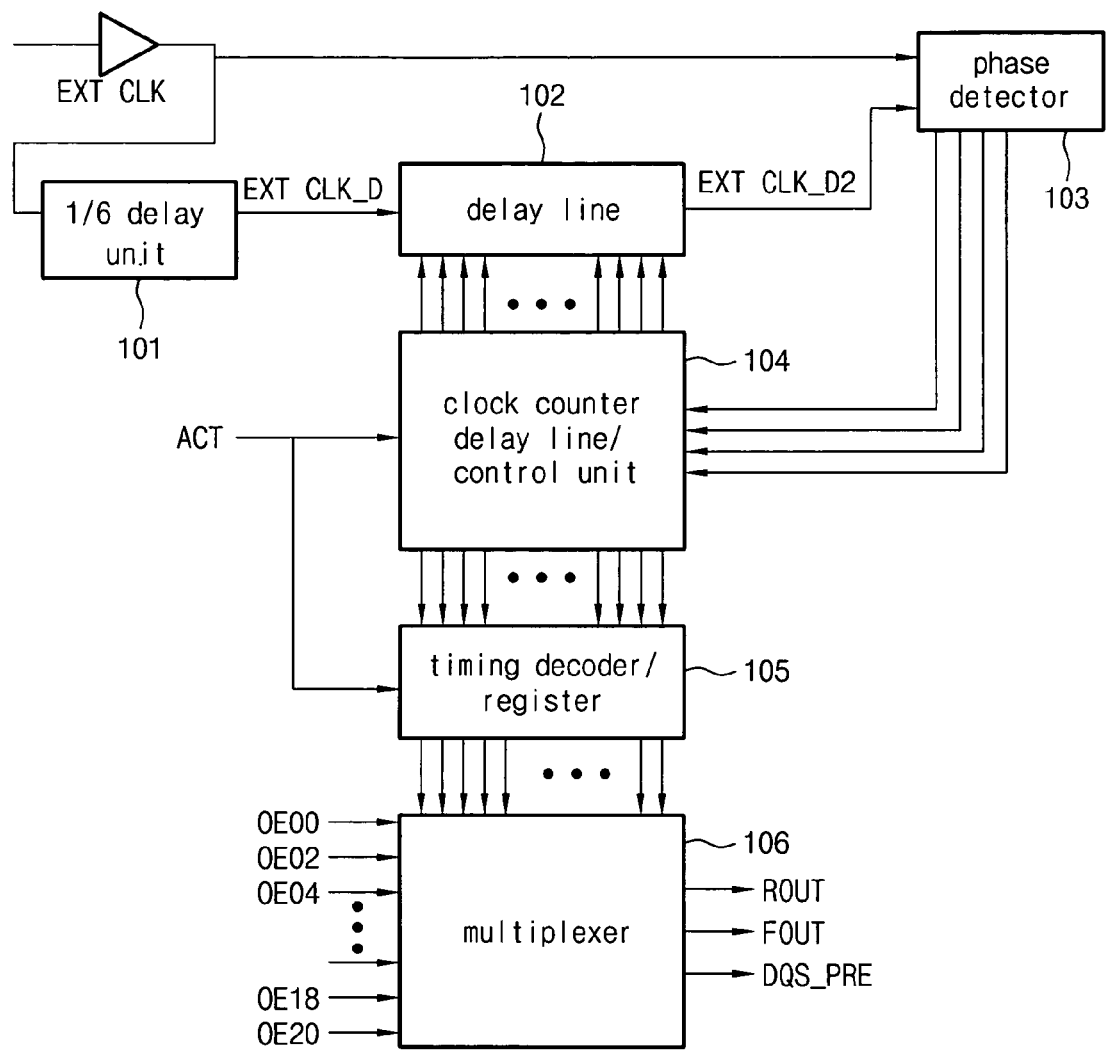
FIG. 1 is a block diagram of a data output controller according to one embodiment of the present invention.

FIG. 1 is a block diagram of a data output controller according to one embodiment of the present invention.

The data output controller shown in FIG. 1 includes a delay unit 101 for delaying an external clock signal, a delay line 102 for delaying an output signal of the delay unit 101, a phase detector 103 for detecting a differential phase between the external clock signal and the output signal of the delay line 102, a clock counter/delay line control unit 104 for outputting a counter signal capable of controlling a time delay of the delay line 102 in response to an output signal of the phase detector 103, a timing decoder/register 105 for checking frequency of the external clock signal in response to an output signal of the clock counter/delay line control unit 104 and storing frequency information therein, and a multiplexer 106 for receiving a plurality of output enable control signals.

A method for controlling an output of data in a semiconductor memory device having the above data output controller according to the present invention includes the steps of detecting a unit delay multiple of an external clock signal based on the external clock signal and a delay of the external clock signal, performing an analysis in an information storage unit, in which an internal timing is defined, based on a detected unit delay multiple, and adjusting a data output timing in accordance with predetermined CAS latency based on a value obtained through the analysis.

The delay unit 101 receives the external clock signal EXT CLK and the output signal EXT CLK_D of the delay unit 101 is obtained through delaying the external clock signal EXT CLK by a predetermined time. According to the present invention, the external clock signal EXT CLK is delayed by ⅙ tCLK, which is a period of the external clock signal EXT CLK.

Figure 3:
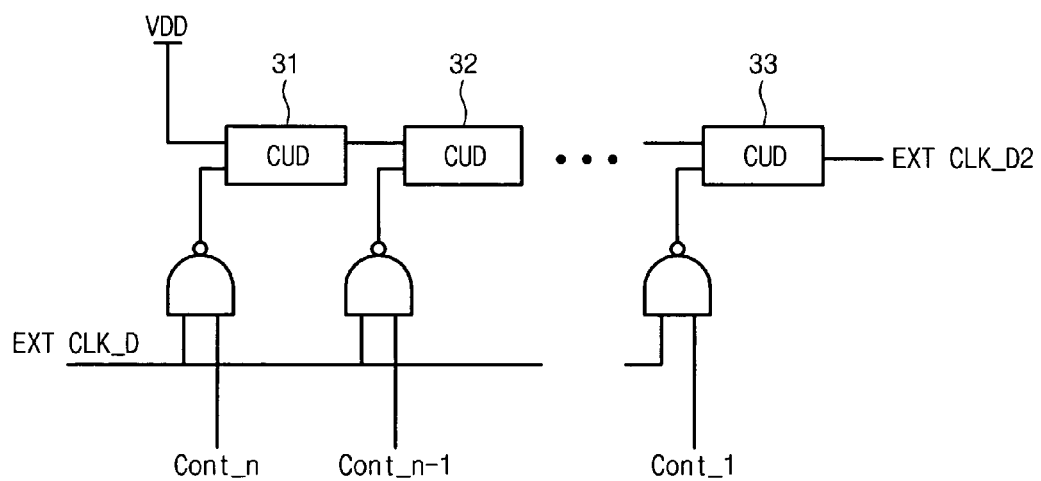
FIG. 3 is a view illustrating a delay line shown in FIG. 1.

The delay line 102 receives the output signal EXT CLK_D of the delay unit 101 and the output signal EXT CLKD2 of the delay line is obtained through delaying the output signal EXT CLK_D of the delay unit 101 by a predetermined time. At an initial stage, the time delay for the delay line 102 is substantially "zero". Thus, the output signal EXT CLK_D of the delay unit 101 is transferred to the phase detector without a time delay. A circuit structure of the delay line 102 is shown in FIG. 3. As shown in FIG. 3, the delay line 102 includes a plurality of unit delay devices 31 to 33.

Figure 2:
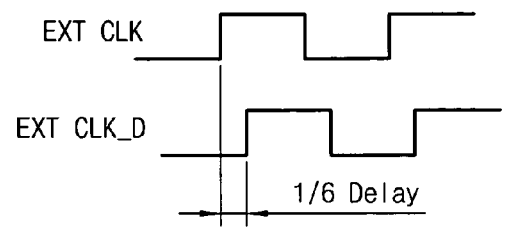
FIG. 2 is a view showing waveforms of an external clock signal and a delay signal passing through a delay section.

The phase detector 103 compares the external clock signal EXT CLK with the output signal EXT CLK_D2 of the delay line 102. Since the time delay for the delay line 102 is zero in the initial stage, the phase detector 103 may detect a differential phase of ⅙tCLK as shown in FIG. 2. FIG. 2 shows the differential phase between the external clock signal EXT CLK and the output signal EXT CLK_D2 of the delay line 102 in the initial stage.

That is, the phase detector 103 detects the differential phase between the external clock signal EXT CLK and the output signal EXT CLK_D2 of the delay line 102.

The output signal of the phase detector 103 is transferred to the clock counter/delay line control unit 104.

The clock counter/delay line control unit 104 adjusts a time delay for the delay line 102 in response to the output signal of the phase detector 103. That is, the clock counter/delay line control unit 104 generates a plurality of counter signals in order to adjust the time delay of the delay line 102. For instance, as shown in FIG. 3, the clock counter/delay line control unit 104 adjusts a delay signal EXT CLK_D applied to the delay line 102 by using counter signals (Cont_n, Cont_n−1, . . . , and Cont_1).

The timing decoder/register 105 detects the number of enabled counter signals in response to the counter signals of the clock counter/delay line control unit 104 and stores the number of enabled counter signals in a register. The time delay of the counter signal can be detected by checking the number of enabled counter signals.

That is, if a signal generated by analyzing a read command is a CASP-RD signal, a timing decoder has a timing of an internal signal in the form of a ROM, in which a period of time required for generating the CASP-RD signal on the basis of an input of an external clock is stored as a multiple of CUD shown in FIG. 3. Such data are predetermined in the initial stage of designing the timing decoder. In addition, the timing decoder has a read replica in the form of a ROM as a multiple of the CUD. The timing decoder calculates cycles of lost DDL-clocks by adding the above data to each other. The multiplexer 106 controls an operation of the semiconductor memory device based on the calculated data.

A signal outputted from the timing decoder/register 105 represents the degree of time delay.

The ACT signals applied to the clock counter/delay line control unit 104 and the timing decoder/register 105 are enable signals.

Figure 9:
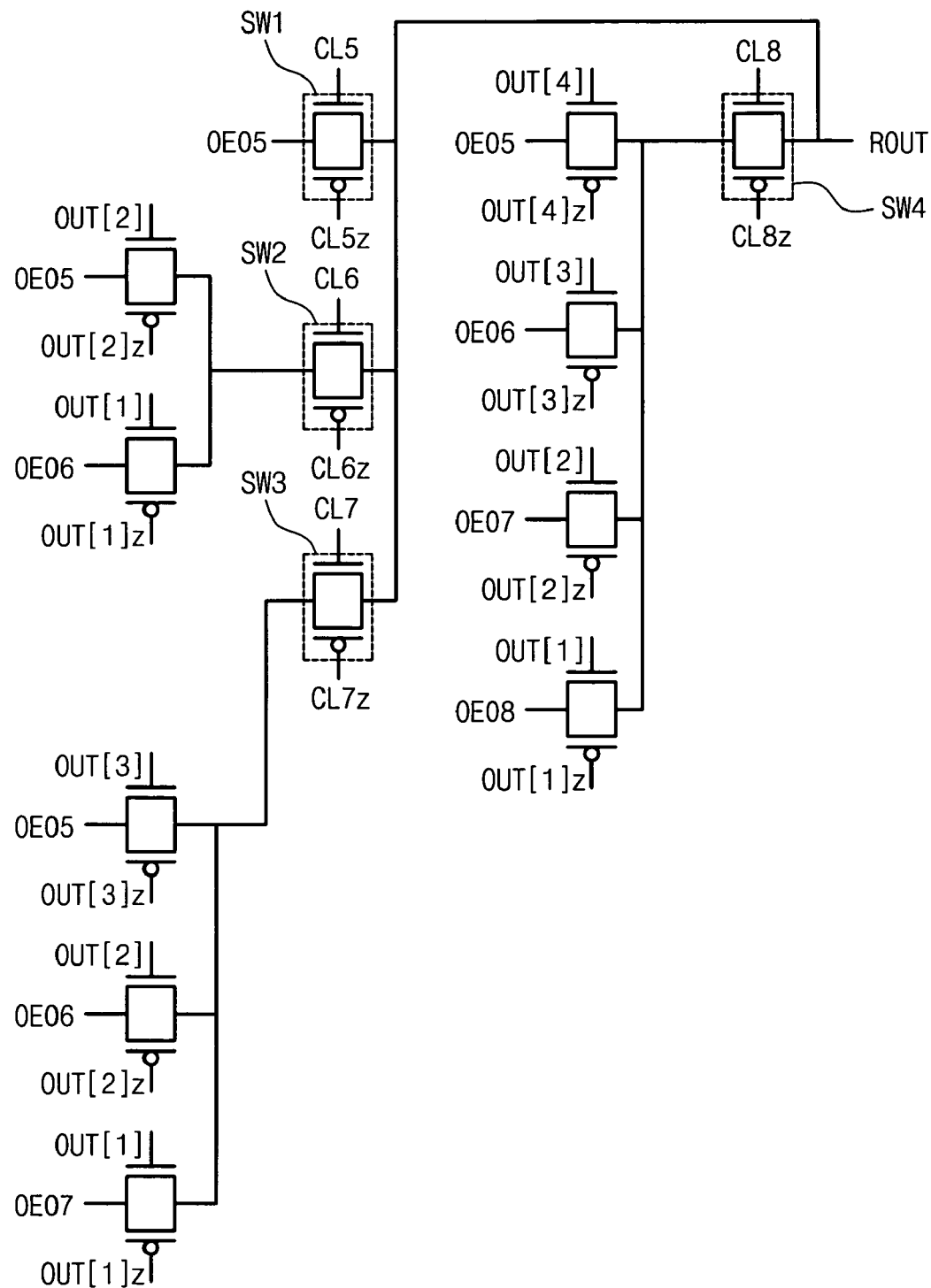
FIG. 9 is a circuit view for explaining an operation of a multiplexer shown in FIG. 1.

The multiplexer 106 receives signals outputted from the timing decoder/register 105. FIG. 9 shows an example of the multiplexer 106.

Referring to FIG. 9, the multiplexer 106 receives a plurality of output enable signals (OE00, OE02, OE04, ..., OE18, and OE20) and selects one of the output enable signals (OE00, OE02, OE04, ..., OE18, and OE20) in response to the output signal of the timing decoder/register 105. Herein, two-figured numbers of the output enable signals (OE00, OE02, OE04, ..., OE18, and OE20) represent the CAS latency. For example, OE04 represents that the CAS latency is 4. A concept of the present invention regarding the above CAS latency will be described later in detail with reference to FIG. 9.

The output signal ROUT of the multiplexer 106 is a control signal synchronized with a rising edge of a clock so as to output data, an output signal FOUT of the multiplexer 106 is a control signal synchronized with a falling edge of a clock so as to output data, and an output signal DQS_PRE of the multiplexer 106 is a control signal for generating an internal DQS signal.

FIG. 2 is a view showing waveforms of an external clock signal EXT CLK and a delay signal EXT CLK_D passing through the delay section 101. As can be understood from FIG. 2, the delay signal EXT CLK_D is outputted while being delayed by ⅛tCLK with regard to the external clock signal EXT CLK.

FIG. 3 is a view illustrating the delay line shown in FIG. 1.

Referring to FIG. 3, "CUD (coarse unit delay)" represents a unit delay device, and counter signals (Cont_n, Cont_n−1, ..., and Cont_1) are signals outputted from the clock counter/delay line control unit 104. As is understood from FIG. 3, the time delay before the delay signal EXT CLK_D has passed through the delay line is determined according to a logic level of the counter signals.

Figure 4:
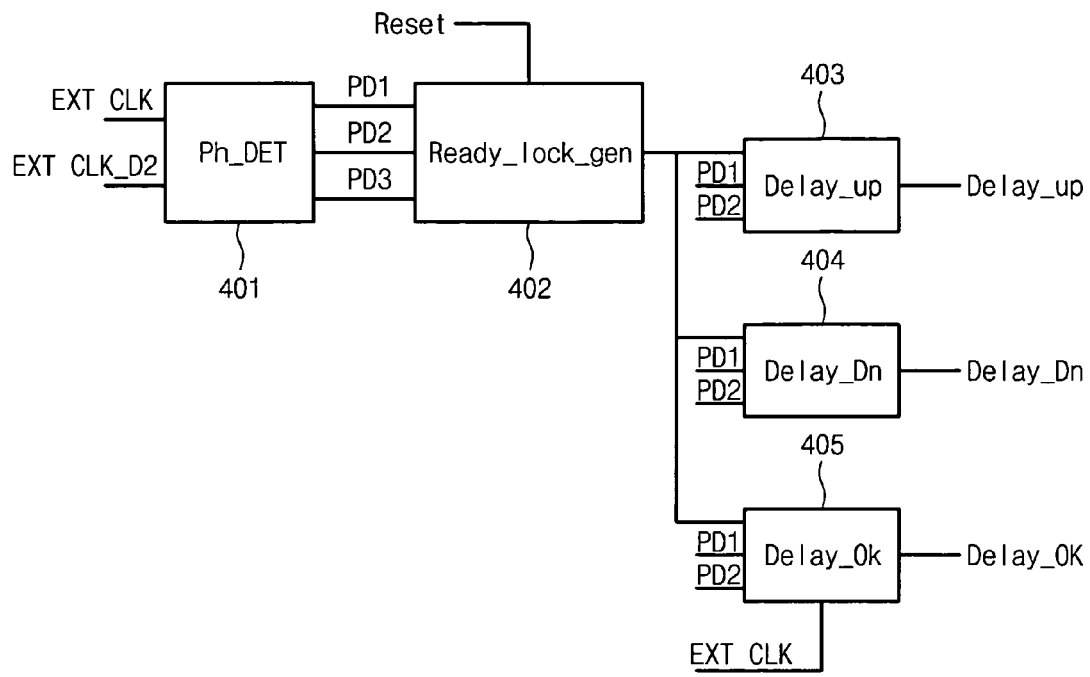
FIG. 4 is a view illustrating a phase detector shown in FIG. 1.

FIG. 4 is a view illustrating the phase detector 103 shown in FIG. 1.

The phase detector 103 includes a detector 401, a lock signal generator 402, a delay-up unit 403, a delay-down unit 404 and a detection termination unit 405.

The detector 401 includes a circuit for comparing a phase of the external clock signal EXT CLK with a phase of the delay signal EXT CLK_D2, which is an output signal of the delay line 102.

Figure 5:
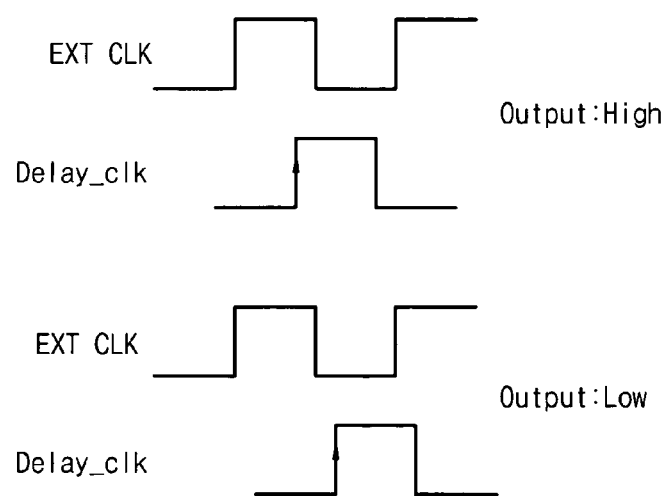
FIG. 5 is a view for explaining a basic operation of a detector shown in FIG. 4.
Figure 7:
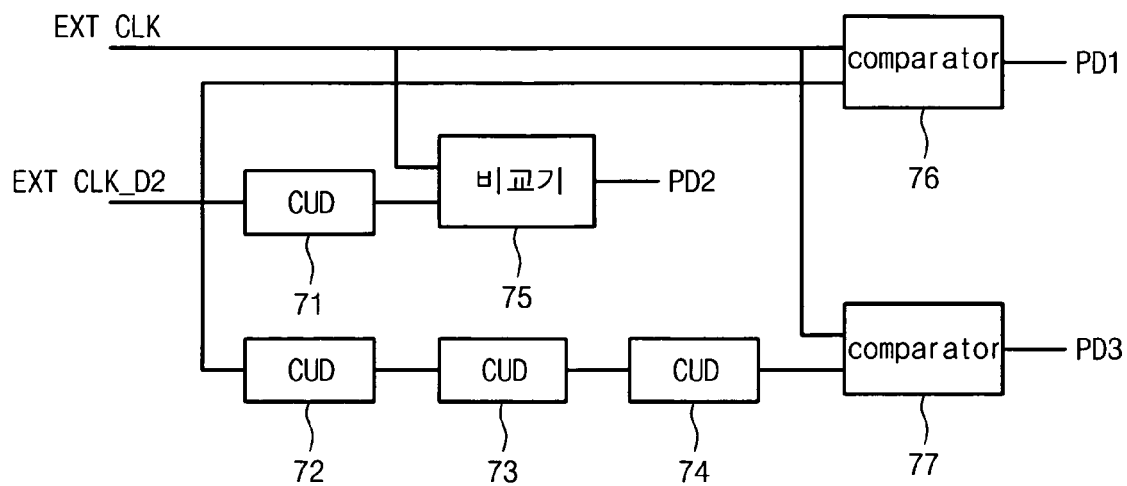
FIG. 7 is a block diagram of a detector shown in FIG. 4.

FIG. 7 is a block diagram of the detector 401. As shown in FIG. 7, the detector 401 includes comparators 75, 76 and 77. The comparator 76 directly compares the phase of the external clock signal EXT CLK with the phase of the delay signal EXT CLK_D2. An output signal of the comparator 76 is "PD1". The comparator 75 compares the external clock signal EXT CLK with the delay signal EXT CLK_D2 passing through a unit delay device 71. An output signal of the comparator 75 is "PD2". The comparator 77 compares the external clock signal EXT CLK with the delay signals EXT CLK_D2 passing through three unit delay devices 72, 73 and 74 which are connected to each other in series. An output signal of the comparator 77 is "PD3". Hereinafter, a logic level of signals outputted from the comparators 75, 76 and 77 will be described with reference to FIG. 5. In FIG. 5, EXT CLK represents an external clock signal, and Delay_clk represents signals applied to the comparators 75, 76 and 77 shown in FIG. 7. As can be understood from FIG. 5, if the external clock signal EXT CLK is a high level during a rising edge of the delay signal Delay_clk, outputs of the comparators are high levels. In contrast, if the external clock signal EXT CLK is a low level during the rising edge of the delay signal Delay_clk, outputs of the comparators are low levels. For example, in FIG. 7, if the external clock signal EXT CLK is a high level during the rising edge of the delay signal EXT CLK_D2 applied to the comparator 75 through the unit delay device 71, the comparator 75 outputs a high level signal. In contrast, if the external clock signal EXT CLK is a low level during the rising edge of the delay signal EXT CLK_D2 applied to the comparator 75 through the unit delay device 71, the comparator 75 outputs a low level signal.

Figure 8:
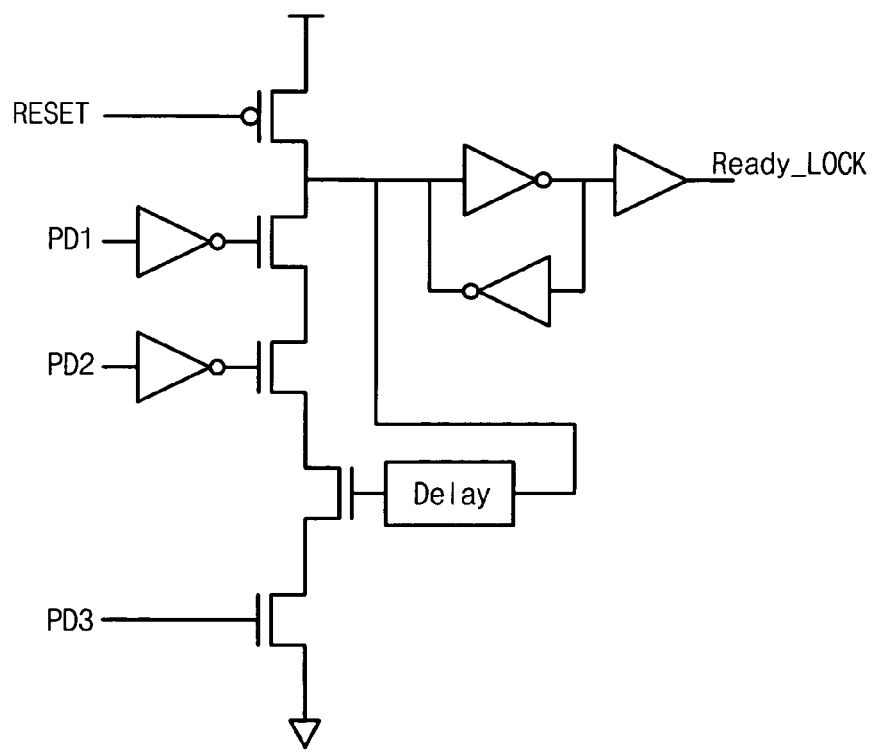
FIG. 8 is a circuit view of a lock generator shown in FIG. 4.

The lock signal generator 402 shown in FIG. 4 checks an amount of the time delay by receiving output signals PD1, PD2 and PD3 of the detector 401. FIG. 8 shows an example of the lock signal generator 402 shown in FIG. 4. As shown in FIG. 8, if logic levels of the output signals PD1, PD2 and PD3 of the detector 401 are L, L, and H, respectively, an output signal Ready_LOCK of the lock signal generator 402 becomes a high level. Otherwise, the output signal Ready_LOCK of the lock signal generator 402 is a low level.

The delay-up unit 403 outputs a signal Delay_up for increasing the time delay of the delay line 102. Upon receiving the signal Delay_up, the clock counter/delay line control unit 104 increases the time delay of the delay line 102.

The delay-down unit 404 outputs a signal Delay_Dn for decreasing the time delay of the delay line 102. Upon receiving the signal Delay_Dn, the clock counter/delay line control unit 104 decreases the time delay of the delay line 102.

The detection termination unit 405 outputs a signal Delay_OK for adjusting the time delay of the delay line 102. Upon receiving the signal Delay_OK, the clock counter/delay line control unit 104 fixes the time delay of the delay line 102.

Figure 6:
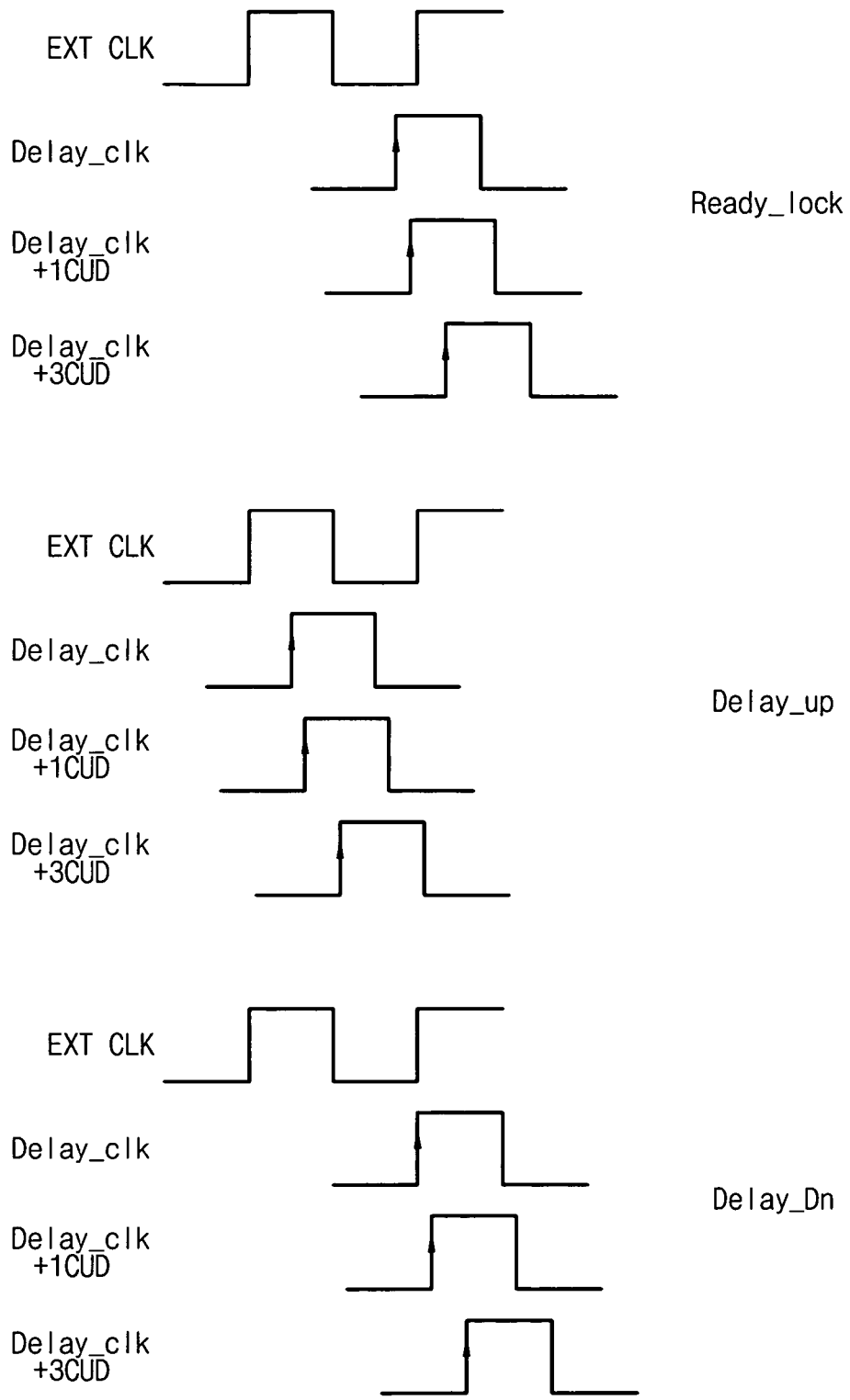
FIG. 6 is a view showing signals when an output signal of a detection termination unit is enabled, an output signals of a delay-up unit is enabled, and an output signal of a delay-down unit is enabled.

FIG. 6 is a view showing signals when an output signal of the detection termination unit 405 is enabled, an output signals of the delay-up unit 403 is enabled, and an output signal of the delay-down unit 404 is enabled.

In FIG. 6, a signal Delay_clk is identical to the signal EXT_CLKD2 shown in FIG. 6.

As is understood from FIG. 6, an output signal for determining an increase, a decrease or a fixation of the time delay of the delay line is generated by detecting a differential phase between the external clock signal EXT CLK and the delay signal.

FIG. 7 is a block diagram of the detector 401 shown in FIG. 4.

FIG. 8 is a circuit view of the lock generator 402 shown in FIG. 4.

FIG. 9 is a circuit view for explaining an operation of the multiplexer 106 shown in FIG. 1, in which the multiplexer 106 generates the output signal ROUT according to the CAS latency. That is, FIG. 9 is not a full circuit view of the multiplexer 106 shown in FIG. 1, but a circuit view for explaining only a procedure of the multiplexer 106 outputting the ROUT signal. However, the circuit diagram shown in FIG. 9 is not significantly different from the circuit diagram of the multiplexer 106 generating output signals FOUT and DQS_PRE shown in FIG. 1.

In FIG. 9, OE05, OE06, OE07 and OE08 represent output enable signals for enabling output data when CL is 5, 6, 7 and 8, respectively.

Generally, if the CL is 5, data are outputted through an output circuit after 5 clocks from the read command. At this time, a signal for controlling an operation of the data output driver is OE05.

However, in cases of high-speed memory devices, such as DDR SDRAM and DDR2 SDRAM, described in relation to the prior art, it is difficult to precisely match the CAS latency with the output enable control signal due to an increase of frequency of the clock signal.

In order to solve the above problem, the present invention suggests a method of outputting data by externally synchronizing the data with the CAS latency while selectively using the output enable control signal if the CAS latency of the memory device is determined.

Hereinafter, the present invention will be described in detail with reference to FIG. 9. For reference, OUT[1], OUT[2], OUT[3] and OUT[4] are output signals of the timing decoder/register 105 shown in FIG. 1.

If the CL of the memory device is 5, a switch SW1 is enabled. Accordingly, the output enable signal OE05 is transferred to the output terminal ROUT while passing through the switch SW1.

If the CL of the memory device is 6, a switch SW2 is enabled. Accordingly, after one of the output enable control signals OE05 and OE06 has been selected, the selected enable control signal is transferred to the output terminal ROUT by passing through the switch SW2. For instance, when the frequency of the clock signal applied to the memory device is maintained in a proper range, if the CL is 6, the output enable control signal OE06 is transferred to the output terminal ROUT by passing through the switch SW2. However, when the frequency of the clock signal applied to the memory device exceeds the proper range, it may be difficult to output the data by synchronizing the data with the CL=6, if the output enable control signal OE06 is employed. In this case, the data output operation of the high-speed memory device can be stably performed if the output enable control signal OE05 is employed.

If the CL of the memory device is 7, a switch SW3 is enabled. Accordingly, after one of the output enable control signals OE05, OE06, and OE07 has been selected, the selected enable control signal is transferred to the output terminal ROUT by passing through the switch SW3. In this case, a basic operation of the memory device is identical to that of the memory device having the CL of 6.

If the CL of the memory device is 8, a switch SW4 is enabled. Accordingly, after one of the output enable control signals OE05, OE06, OE07 and OE08 has been selected, the selected enable control signal is transferred to the output terminal ROUT by passing through the switch SW4. In this case, a basic operation of the memory device is identical to that of the memory device having the CL of 6.

Figure 10:
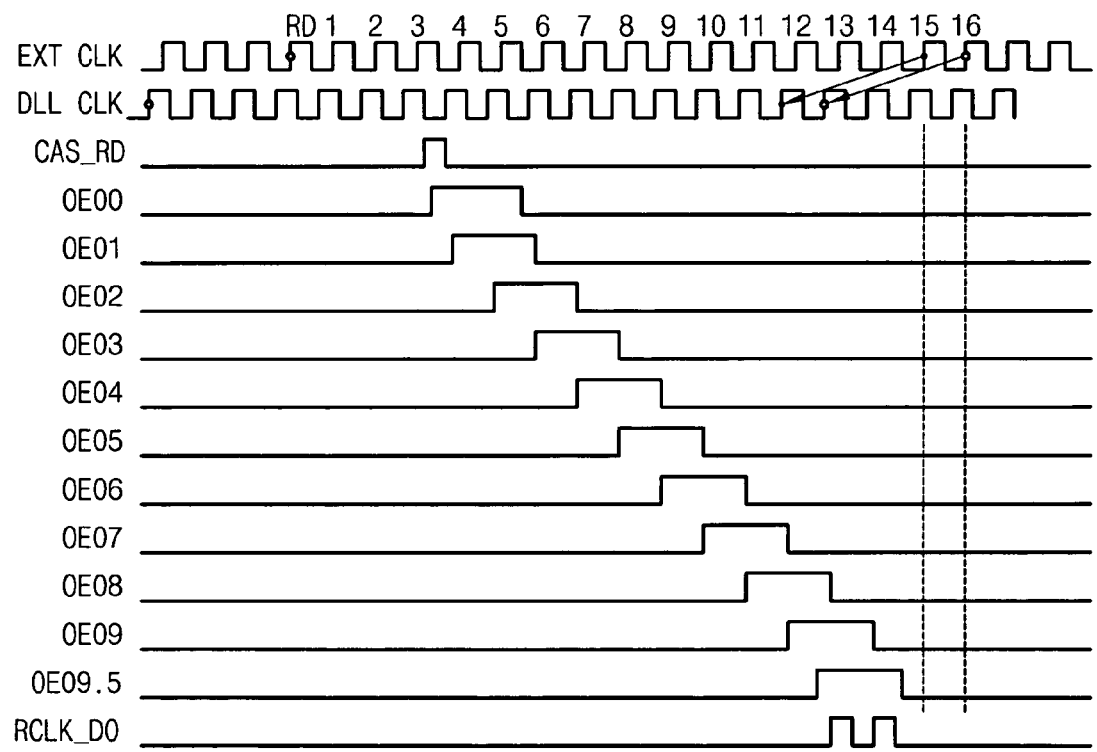
FIG. 10 is a view showing a waveform of a signal when CAS latency is 16.

FIG. 10 is a view showing a waveform of a signal when the CAS latency is 16.

In FIG. 10, EXT CLK is an external clock signal, DLL CLK is an internal clock signal, RD is a read command, CAS_RD is an internal read command generated after 3 clocks from the external clock signal in response to the read command, and RCLK_D0 is a signal for outputting data by synchronizing the data with a rising edge of a clock of the internal clock signal.

As shown in FIG. 10, the internal read command CAS_RD is generated after 3 clocks from the read command RD.

An output enable control signal OE00 is generated while being synchronized with the rising edge of the internal read command CAS_RD. In addition, an output enable control signal OE01 is generated while being synchronized with the rising edge of the output enable control signal OE00. Remaining output enable control signals are also sequentially outputted in the same manner. Therefore, an output enable control signal OE09 is outputted while being synchronized with the rising edge of the output enable control signal OE08. In addition, an output enable control signal OE09.5 is outputted while being synchronized with the rising edge of the output enable control signal OE09.

A shown in FIG. 10, if the CL is 16, data must be outputted after 16 clocks from the read command RD caused by the external clock signal EXT CLK. However, since the memory device having the CL of 16 has high frequency, data cannot be outputted within a period of time defined in the specification. Thus, in this case, it is preferred to generate a control signal so as to output data during a high level period of the output enable control signal OE09.5 as shown in FIG. 10. The RCLK_DO signal can be obtained through performing an AND operation with regard to the output enable control signal OE09.5 and the internal clock signal DLL CLK. Although it is not illustrated, data are outputted while being synchronized with the rising edge of the RCLK_DO signal after 16 clocks from the external clock signal EXT CLK corresponding to CL=16.

In short, in a case of a high-speed memory device, the internal read command CAS_RD is generated after 3 clocks from the external clock signal EXT CLK. If the time delay, which is inevitably consumed during the internal read operation, is about 3 clocks, an internal error of 6 clocks may occur if the CL is 16. Thus, a count number for the internal clock signal DLL CLK is about 10 clocks. According to the present invention, the data are outputted at a point of time corresponding to "CL=16" on the basis of the internal clock signal DLL CLK, which matches with the output enable control signal OE09.5.

As describe above, the present invention provides a method of internally adjusting the data output operation if the data output does not match with the CAS latency due to a characteristic of the high-speed memory device.

Accordingly, the data output operation can be stably carried out even if the CAS latency becomes increased.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A data output controller of a semiconductor device, the data output controller comprising:
    a delay unit for delaying an external clock signal;
    a delay line for delaying an output signal of the delay unit;
    a phase detector for detecting a differential phase between the external clock signal and an output signal of the delay line;
    a clock counter/delay line control unit for outputting a counter signal capable of controlling a time delay of the delay line in response to an output signal of the phase detector;
    a timing decoder/register for checking frequency of the external clock signal in response to an output signal of the clock counter/delay line control unit and storing information related to the frequency; and
    a multiplexer for receiving a plurality of output enable control signals, wherein the multiplexer selects one of output enable control signals according to the frequency information of the external clock signal which is checked by the timing decoder/register, and the output enable control signals include CAS latency of the semiconductor memory device and control an operation of an output driver of the semiconductor memory device.

2. The data output controller as claimed in claim 1, wherein, if the CAS latency of the memory device is n, the output enable control signal outputted from the multiplexer includes one of a first output enable control signal representing the CAS latency of n, a second output enable control signal representing the CAS latency of n−1, and a third output enable control signal representing the CAS latency of n−2.

3. The data output controller as claimed in claim 1, wherein, if the CAS latency of the memory device is n, the output enable control signal outputted from the multiplexer includes one of a first output enable control signal representing the CAS latency of n and a plurality of output enable control signals representing the CAS latency less than n.

4. The data output controller as claimed in claim 1, wherein, the phase detector includes a detector for comparing a phase of the external clock signal with a phase of a delay signal, which is the output signal of the delay line and for outputting a plurality of comparison signals according to a differential phase between the external clock signal and the delay signal, a lock signal generator for checking a degree of time delay by receiving the comparison signals of the detector, a delay-up unit for outputting a signal capable of increasing the time delay of the delay line, a delay-down unit for outputting a signal capable of decreasing the time delay of the delay line, and a detection termination unit for terminating an operation for adjusting the time delay of the delay line.

5. A data output controller of a semiconductor device, the data output controller comprising:
   a first means for detecting a unit delay multiple of an external clock signal based on the external clock signal and a delay circuit of the external clock signal;
   a second means for analyzing data in an information storage unit, in which an internal timing is defined, by using values detected by the first means; and
   a third means for adjusting a data output timing in accordance with predetermined CAS latency based on analyzed values obtained through the second means.

6. The data output controller as claimed in claim 5, wherein the first means includes a delay unit for delaying the external clock signal, a delay line for delaying an output signal of the delay unit, and a phase detector for detecting a differential phase between the external clock signal and an output signal of the delay line.

7. The data output controller as claimed in claim 6, wherein the second means includes a clock counter/delay line control unit for outputting a counter signal capable of controlling a time delay of the delay line in response to an output signal of the phase detector and a timing decoder/register for checking frequency of the external clock signal in response to an output signal of the clock counter/delay line control unit and storing information related to the frequency.

8. The data output controller as claimed in claim 7, wherein the third means includes a multiplexer for receiving a plurality of output enable control signals in order to control a data output enable time n response to an output signal of the timing decoder/register.

* * * * *